(12) United States Patent
Liao et al.

(10) Patent No.: US 7,541,816 B1
(45) Date of Patent: Jun. 2, 2009

(54) CAPACITIVE SENSOR

(75) Inventors: Tung-Tsai Liao, Hsin Chu (TW); Li Sheng Lo, Hsin Chu (TW)

(73) Assignee: Generalplus Technology Inc., Hsinchu (TW)

( * ) Notice: Subject to any disclaimer, the term of this patent is extended or adjusted under 35 U.S.C. 154(b) by 0 days.

(21) Appl. No.: 12/199,385

(22) Filed: Aug. 27, 2008

(30) Foreign Application Priority Data

May 5, 2008 (TW) .............................. 97116418 A

(51) Int. Cl.
  *G01R 27/26* (2006.01)
(52) U.S. Cl. .................. 324/676; 324/548; 324/658; 324/678; 324/688; 324/661; 361/278; 361/280; 361/291; 361/292
(58) Field of Classification Search ............. 324/676, 324/548, 658, 678, 661, 688; 73/724, 753–754; 361/278–280, 290–292
See application file for complete search history.

(56) References Cited

U.S. PATENT DOCUMENTS

| | | | |
|---|---|---|---|
| 6,194,903 B1 * | 2/2001 | Schulz .................. 324/661 |
| 6,452,514 B1 * | 9/2002 | Philipp .................. 341/33 |
| 6,496,348 B2 * | 12/2002 | McIntosh .............. 361/115 |
| 6,993,607 B2 | 1/2006 | Philipp | |
| 7,049,827 B2 * | 5/2006 | Horz et al. ............ 324/632 |
| 7,077,003 B2 * | 7/2006 | Tsuruoka et al. ........ 73/313 |
| 7,116,117 B2 * | 10/2006 | Nakano et al. ......... 324/688 |
| 7,262,609 B2 | 8/2007 | Reynolds | |
| 7,288,946 B2 | 10/2007 | Hargreaves et al. | |
| 7,291,939 B2 * | 11/2007 | Hoekstra .............. 307/140 |
| 7,301,350 B2 | 11/2007 | Hargreaves et al. | |
| 7,307,485 B1 | 12/2007 | Snyder et al. | |
| 7,325,457 B2 * | 2/2008 | Fujimori et al. ......... 73/724 |

\* cited by examiner

*Primary Examiner*—Nguyen T Ha
(74) *Attorney, Agent, or Firm*—Muncy, Geissler, Olds & Lowe, PLLC

(57) ABSTRACT

In a capacitive sensor, a sensing electrode is positively charged, the sensing electrode and a sensing capacitor are charge-balanced, the sensing electrode is negatively charged, and then the sensing electrode and the sensing capacitor are again charge-balanced. The sensing electrode is positively and negatively charged in the same period when the capacitive sensor is sensed. So, the invention can not only effectively improve the high-frequency external interference but also effectively resist the interference when an external direct current electrical field approaches.

16 Claims, 7 Drawing Sheets

CAPACITIVE SENSOR

This application claims priority of No. 097116418 filed in Taiwan R.O.C. on May 5, 2008 under 35 USC 119, the entire content of which is hereby incorporated by reference.

BACKGROUND OF THE INVENTION

1. Field of Invention

The invention relates in general to a touch sensor, and more particularly to a capacitive sensor with the immunity from the alternating Current power.

2. Related Art

Recently, many control buttons, such as buttons of an elevator or buttons of an electronic game console, have been changed from the conventional mechanical spring buttons into touch sensors due to the progress of the technology. FIG. 1 is a circuit diagram showing a conventional capacitive sensor. Referring to FIG. 1, the circuit includes a sensing electrode 101, a resistor 102 and a sense-control end 103. In this circuit, the sensing electrode 101 corresponds to a grounded capacitor.

FIG. 2 shows operation waveforms at the node A between the sensing electrode 101 and the resistor 102 in the conventional capacitive sensor. As shown in FIGS. 1 and 2, the sense-control end 103 charges the node A to a first rated voltage V20 at the beginning, and makes the node A in a high impedance state. Next, since the sensing electrode 101 corresponds to the grounded capacitor, the sensing electrode 101 starts to discharge through the resistor 102. The sense-control end 103 continuously detects the voltage of the node A. When the voltage of the node A is discharged to a second rated voltage V21, the sense-control end 103 judges whether or not a finger contacts the sensing electrode 101 according to the time, for which the node A is discharged from the first rated voltage V20 to the second rated voltage V21, and then charges the node A again.

As shown in FIG. 2, the waveform 201 represents the waveform of the node A when the finger does not yet touch the sensing electrode 101, while the waveform 202 represents the waveform of the node A after the finger touches the sensing electrode 101. According to this waveform diagram, when the finger touches the sensing electrode 101, the equivalent capacitance of the sensing electrode 101 is increased. So, the discharge time T2 of the waveform 202 is longer than the discharge time T1 of the waveform 201. Thus, the sense-control end 103 only has to judge that the time for which the node A is discharged to the second rated voltage V21 is longer than T1, and thus to determine that the sensing electrode 101 has been touched.

FIG. 3 is a circuit diagram showing another conventional capacitive sensor. Referring to FIG. 3, the circuit includes a sensing electrode 301, a capacitor 302 and two sense-control ends 303 and 304. When this capacitive sensor performs a sensing operation, the sense-control end 304 charges the sensing electrode 301. Thereafter, the charges stored in the sensing electrode 301 are shared with the capacitor 302. According to the voltage detected by the sense-control end 303, the equivalent capacitance of the sensing electrode 301 with respect to the ground can be estimated.

FIG. 4 is a circuit diagram showing still another capacitive sensor. Referring to FIG. 4, the circuit includes a sensing electrode 401, a voltage detector 402, a switch element 403 and a control circuit 404. When this capacitive sensor is performing the sensing operation, the control circuit 404 controls the switch element 403 so that the sensing electrode 401 can be charged. Thereafter, the control circuit 404 controls the switch element 403 to make the sensing electrode 401 and the voltage detector 402 be short-circuited, and the voltage detector 402 receives the charges stored in the sensing electrode 401. When the voltage V401 of the capacitor C401 of the voltage detector 402 is higher than a high threshold voltage, the control circuit 404 controls the switch element 403 so that the sensing electrode 401 is continuously charged. When the voltage V401 of the capacitor C401 of the voltage detector 402 is discharged to a low threshold voltage, the control circuit 404 again controls the switch element 403 to make the sensing electrode 401 and the voltage detector 402 be short-circuited, and the voltage detector 402 again receives the charges stored in the sensing electrode 401, and the above-mentioned operations are repeated.

As mentioned hereinabove, the control circuit 404 switches the switch element 403 according to the voltage V401 of the capacitor C401 of the voltage detector 402. Thus, a control signal S401 for controlling the switch element 403 is a pulse density modulation (PDM) wave. Consequently, whether or not the sensing electrode 401 is touched may be judged according to the value, which is obtained by low-pass filtering and then analog-to-digital converting the control signal S401.

However, the conventional capacitive sensors tend to be influenced by the external electric field and the interference of the alternating current power. Because the conventional capacitive sensor measures the equivalent capacitance of the sensing electrode relative to the ground, the ground starts to become floating due to the interference of the AC power when this capacitive sensor is influenced by the external electric field or when the alternating current (AC) power interference comes into the sensor. Thus, the measured result of the equivalent capacitance may be distorted.

SUMMARY OF THE INVENTION

In view of this, it is therefore an object of the invention to provide a capacitive sensor for avoiding the interference of the AC power.

Another object of the invention is to provide a capacitive sensor for avoiding the interference of the external electric field.

Still another object of the invention is to provide a capacitive sensor, which is used for flat panel scanning and has the relatively low cost.

To achieve the above-identified or other objects, the invention provides a capacitive sensor including a sensing electrode, a sensing capacitor, a first switch element, a second switch element and a third switch element. The first switch element has a first terminal, a second terminal, a third terminal, a fourth terminal and an input terminal. The input terminal of the first switch element is coupled to the sensing electrode. The first terminal of the first switch element is coupled to a first common voltage. The second terminal of the first switch element is coupled to a first terminal of the sensing capacitor. The third terminal of the first switch element is coupled to a second common voltage. The fourth terminal of the first switch element is coupled to a second terminal of the sensing capacitor. The second switch element has a first terminal and a second terminal. The first terminal of the second switch element is coupled to the first terminal of the sensing capacitor. The second terminal of the second switch element is coupled to the first common voltage. The third switch element has a first terminal and a second terminal. The first terminal of the third switch element is coupled to the second terminal of the sensing capacitor. The second terminal of the third switch element is coupled to the second common voltage.

When the circuit is performing a sensing operation, its sensing time is divided into a first period, a second period, a third period and a fourth period. In the first period, the first terminal of the first switch element is electrically connected to the input terminal of the first switch element. In the second period, the second terminal of the first switch element is electrically connected to the input terminal of the first switch element, and the first terminal of the third switch element is electrically connected to the second terminal of the third switch element. In the third period, the third terminal of the first switch element is electrically connected to the input terminal of the first switch element. In the fourth period, the fourth terminal of the first switch element is electrically connected to the input terminal of the first switch element, and the first terminal of the second switch element is electrically connected to the second terminal of the second switch element.

In the capacitive sensor according to the preferred embodiment of the invention, the capacitive sensor further includes a measuring circuit when the first common voltage is lower than the second common voltage. The measuring circuit has at least two aspects to be selected. In the first aspect, the measuring circuit is coupled to the first terminal of the sensing capacitor and measures whether or not a voltage of the first terminal of the sensing capacitor is greater than a threshold voltage in the second period to determine whether or not the capacitive sensor is touched. In the second aspect, the measuring circuit is coupled to the second terminal of the sensing capacitor, and measures whether or not a voltage of the second terminal of the sensing capacitor is greater than a threshold voltage in the fourth period to determine whether or not the capacitive sensor is touched. In a specific embodiment, the capacitive sensor further includes a measuring circuit regardless of the difference between the first common voltage and the second common voltage. The measuring circuit measures whether or not a voltage difference between the first terminal of the sensing capacitor and the second terminal of the sensing capacitor is greater than a threshold voltage to determine whether or not the capacitive sensor is touched. In addition, in a specific embodiment, the capacitive sensor further comprises a fourth switch element. A first terminal of the fourth switch element is coupled to the first terminal of the sensing capacitor, and a second terminal of the fourth switch element is coupled to the second terminal of the sensing capacitor. The sensing time is not entered until the first terminal of the fourth switch element is electrically connected to the second terminal of the fourth switch element for a predetermined time.

The invention also provides a capacitive sensor including a first sensing electrode, a second sensing electrode, a sensing capacitor, a first switch element and a second switch element. Each of the first switch element and the second switch element has a first terminal, a second terminal, a third terminal, a fourth terminal and an input terminal. The input terminal of the first switch element is coupled to the first sensing electrode. The first terminal of the first switch element is coupled to a first common voltage. The second terminal of the first switch element is coupled to a first terminal of the sensing capacitor. The third terminal of the first switch element is coupled to a second common voltage. The fourth terminal of the first switch element is coupled to a second terminal of the sensing capacitor. The input terminal of the second switch element is coupled to the second sensing electrode. The first terminal of the second switch element is coupled to the second common voltage. The second terminal of the second switch element is coupled to the second terminal of the sensing capacitor. The third terminal of the second switch element is coupled to the first common voltage. The fourth terminal of the second switch element is coupled to the first terminal of the sensing capacitor.

When the circuit is performing a sensing operation, its sensing time is divided into a first period, a second period, a third period and a fourth period. In the first period, the first terminal of the first switch element is electrically connected to the input terminal of the first switch element, and the first terminal of the second switch element is electrically connected to the input terminal of the second switch element. In the second period, the second terminal of the first switch element is electrically connected to the input terminal of the first switch element, and the second terminal of the second switch element is electrically connected to the input terminal of the second switch element. In the third period, the third terminal of the first switch element is electrically connected to the input terminal of the first switch element, and the third terminal of the second switch element is electrically connected to the input terminal of the second switch element. In the fourth period, the fourth terminal of the first switch element is electrically connected to the input terminal of the first switch element, and the fourth terminal of the second switch element is electrically connected to the input terminal of the second switch element.

In the capacitive sensor according to the preferred embodiment of the invention, the capacitive sensor further includes a measuring circuit when the first common voltage is lower than the second common voltage. The measuring circuit has at least two aspects to be selected. In the first aspect, the measuring circuit is coupled to the first terminal of the sensing capacitor and measures whether or not a voltage of the first terminal of the sensing capacitor is greater than a threshold voltage in the second period to determine whether or not the capacitive sensor is touched. In the second aspect, the measuring circuit is coupled to the first terminal of the sensing capacitor, and measures whether or not a voltage of the second terminal of the sensing capacitor is greater than a threshold voltage in the fourth period to determine whether or not the capacitive sensor is touched. In a specific embodiment, the capacitive sensor further includes a measuring circuit regardless of the difference between the first common voltage and the second common voltage. The measuring circuit measures whether or not a voltage difference between the first terminal of the sensing capacitor and the second terminal of the sensing capacitor is greater than a threshold voltage to determine whether or not the capacitive sensor is touched. In addition, the capacitive sensor further includes a fourth switch element in a specific embodiment. The fourth switch element has a first terminal coupled to the first terminal of the sensing capacitor, and a second terminal coupled to the second terminal of the sensing capacitor. The sensing time is not entered until the first terminal of the fourth switch element is electrically connected to the second terminal of the fourth switch element for a predetermined time.

The capacitive sensor according to the preferred embodiment of the invention, the capacitive sensor may have many first sensing electrodes and many second sensing electrodes. In addition, a first multiplexer is coupled to and between the first switch element the first sensing electrodes, and a second multiplexer is coupled to and between the second switch element and the second sensing electrodes. If the first sensing electrodes and the second sensing electrodes are respectively arranged to form an X-Y sensing array, the array may be used for flat panel scanning by only controlling the first multiplexer and the second multiplexer.

The essence of the present invention is mainly to positively charge the sensing electrode by controlling the switch element, then to charge-balance the sensing capacitor and the sensing electrode, then to negatively charge the sensing electrode, and finally to charge-balance the sensing electrode and the sensing capacitor. When the sensing capacitor is a sensor, the sensing electrode is positively and negatively charged in the same period. Thus, the invention can not only effectively improve the high-frequency external interference, but also effectively resist the interference when an external direct current electrical field or the AC power approaches.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention.

DETAILED DESCRIPTION OF THE INVENTION

The present invention will be apparent from the following detailed description, which proceeds with reference to the accompanying drawings, wherein the same references relate to the same elements.

Figure 1:
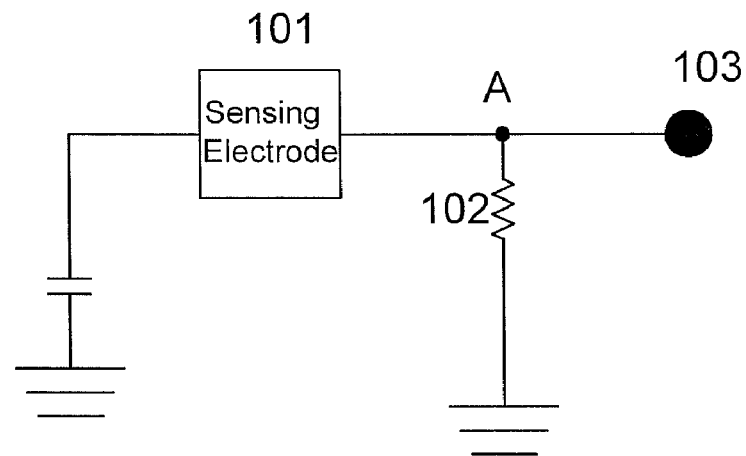
FIG. 1 is a circuit diagram showing a conventional capacitive sensor.
Figure 2:
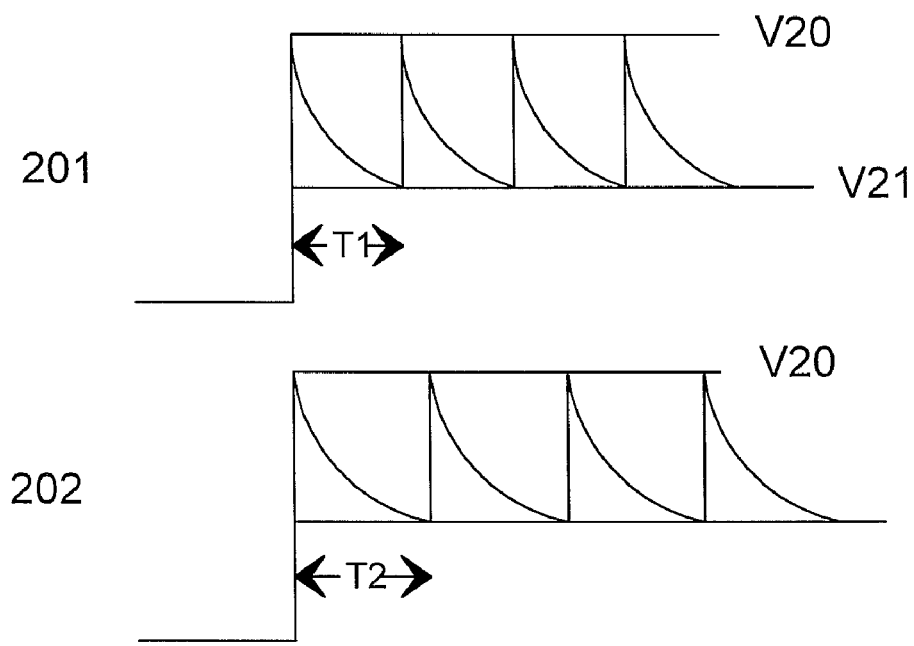
FIG. 2 shows operation waveforms at the node A between a sensing electrode 101 and a resistor 102 in the conventional capacitive sensor.
Figure 3:
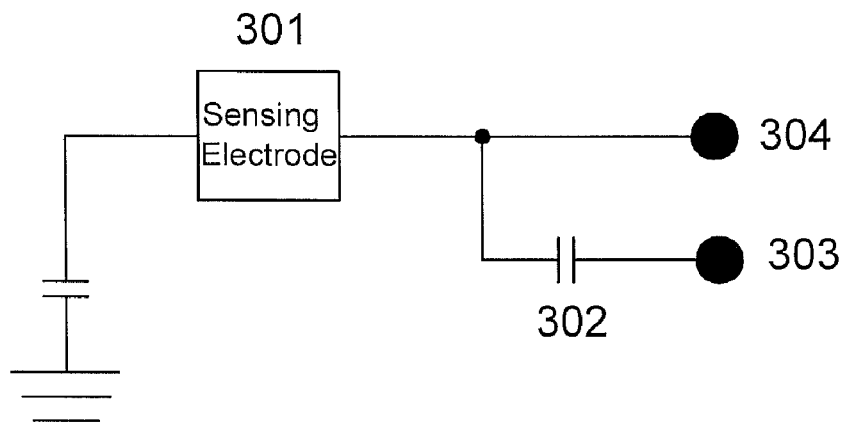
FIG. 3 is a circuit diagram showing another conventional capacitive sensor.
Figure 4:
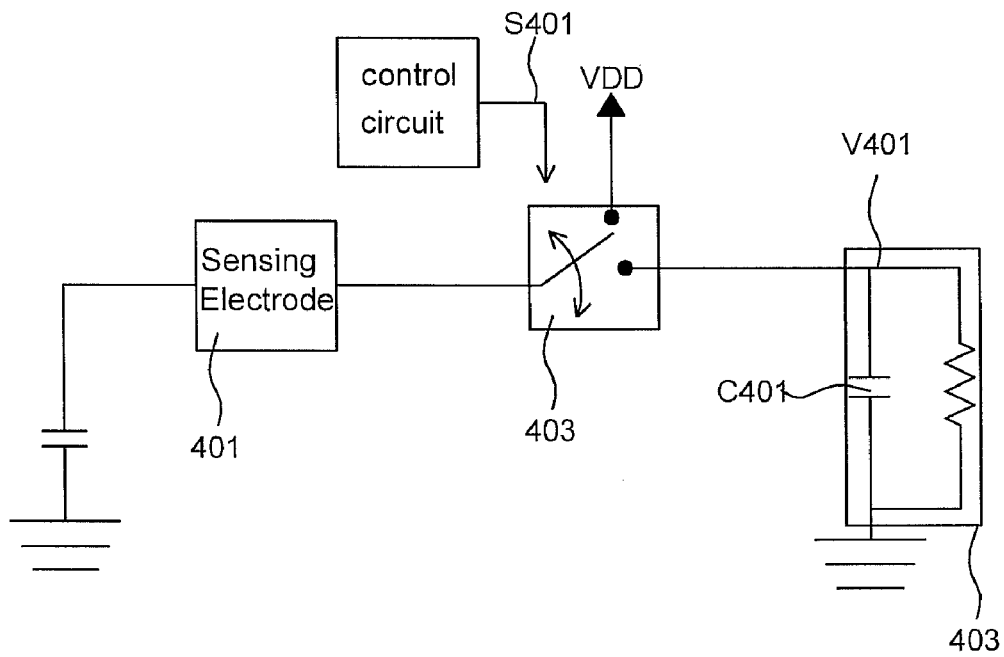
FIG. 4 is a circuit diagram showing still another capacitive sensor.
Figure 5:
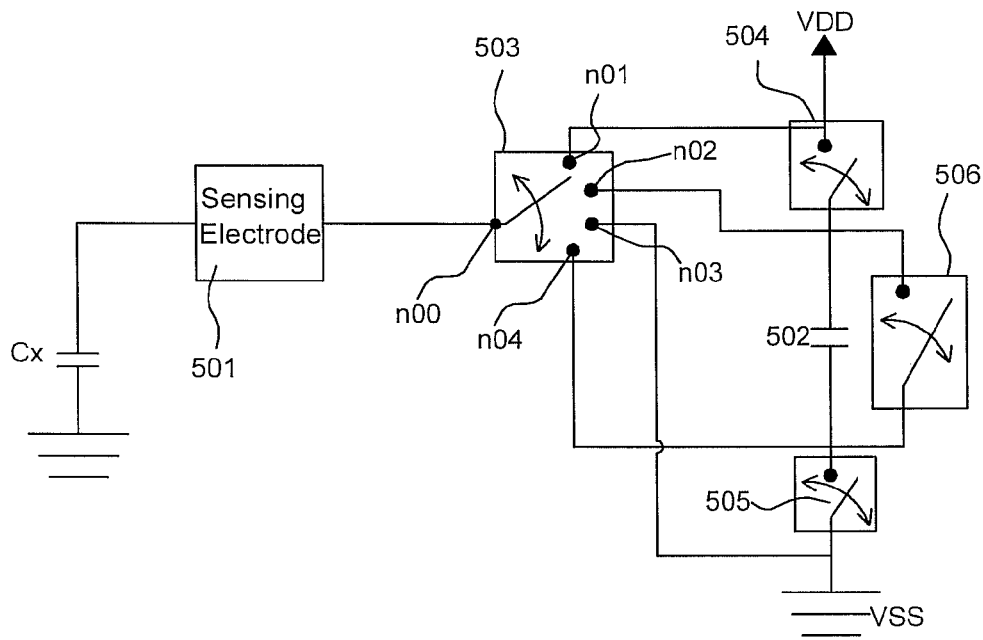
FIG. 5 is a circuit diagram showing a capacitive sensor according to an embodiment of the invention.

FIG. 5 is a circuit diagram showing a capacitive sensor according to an embodiment of the invention. Referring to FIG. 5, the capacitive sensor includes a sensing electrode 501, a sensing capacitor 502, a first switch element 503, a second switch element 504, a third switch element 505 and a fourth switch element 506. In order to describe the operation of this embodiment, nodes n00, n01, n02, n03 and n04, and common voltages VDD and VSS are labeled in FIG. 5. In order to make one of ordinary skill in the art understand the spirit of this invention, it is assumed that the common voltage VDD is a power voltage, and the common voltage VSS is a ground voltage in this embodiment. The circuit connection relationship of this capacitive sensor is illustrated in the drawing.

Regarding the capacitive sensor, the sensing electrode 501 corresponds to a grounded equivalent capacitor Cx. Before the circuit of the capacitive sensor performs a sensing operation, the fourth switch element 506 is first short-circuited so that charges stored in the sensing capacitor 502 are balanced. However, the fourth switch element 506 does not have to be a switch. One of ordinary skill in the art may easily understand that the fourth switch element 506 may be replaced with a resistor if the discharge time and the sensing time are properly controlled. Thus, the invention is not particularly limited thereto.

When the circuit of the capacitive sensor performs the sensing operation, its sensing time is divided into four periods. Thus, the sensing operation is divided into foul steps.

In the first step, the node n00 of the first switch element 503 is electrically connected to the node n01 of the first switch element 503 in the first period. At this time, the sensing electrode 501 is charged to the power voltage VDD.

In the second step, the node n00 of the first switch element 503 is electrically connected to the node n02 of the first switch element 503 and the third switch element 505 is turned on in the second period. At this time, the charges stored in the sensing electrode 501 are shared with the sensing capacitor 502. In the previous step, if a conductor or a finger touches the sensing electrode 501, the equivalent capacitance Cx is increased, the charges stored in the sensing electrode 501 are relatively increased, and the charges shared with the sensing capacitor 502 are relatively increased.

In the third step, the node n00 of the first switch element 503 is electrically connected to the node n03 of the first switch element 503 in the third period. At this time, the sensing electrode 501 is discharged to the ground voltage VSS.

In the fourth step, the node n00 of the first switch element 503 is electrically connected to the node n04 of the first switch element 503 and the second switch element 504 is turned on in the fourth period. At this time, one terminal of the sensing capacitor 502 is coupled to the power voltage VDD through the second switch element 504, and the other terminal of the sensing capacitor 502 is coupled to the sensing electrode 501. So, the charges at the other terminal of the sensing capacitor 502 are shared with the sensing electrode 501. Correspondingly, the negative charges of the sensing electrode 501 are shared with the sensing capacitor 502. Similarly, if the conductor or the finger touches or approaches the sensing electrode 501, the equivalent capacitance Cx is increased, the to-be-shared charges of the sensing electrode 501 are relatively increased, and the charges shared with the sensing capacitor 502 are relatively increased.

According to the repeated operations of the four steps, whether or not the conductor or the finger touches or approaches the sensing electrode 501 can be obtained as long as the voltage difference between the two terminals of the sensing capacitor 502 is detected. In this embodiment, two suggested methods are provided to detect whether the conductor or the finger touches or approaches the sensing electrode 501.

In the first method, the steps are repeated a predetermined number of times, then the voltage difference between the two terminals of the sensing capacitor 502 is measured, and finally the difference is compared with a threshold voltage. Whether or not the conductor or the finger touches or approaches the sensing electrode 501 can be determined according to the compared result.

In the second method, the voltage difference between the two terminals of the sensing capacitor 502 is continuously detected, and the difference is continuously compared with the threshold voltage. When the difference is greater than the threshold voltage, it is judged whether or not the conductor or the finger touches or approaches the sensing electrode 501 according to the number of times of executing the steps.

If a measuring circuit is to be disposed, at least three aspects of the arrangements and connection relationships of the measuring circuit may be selected.

Figure 6:
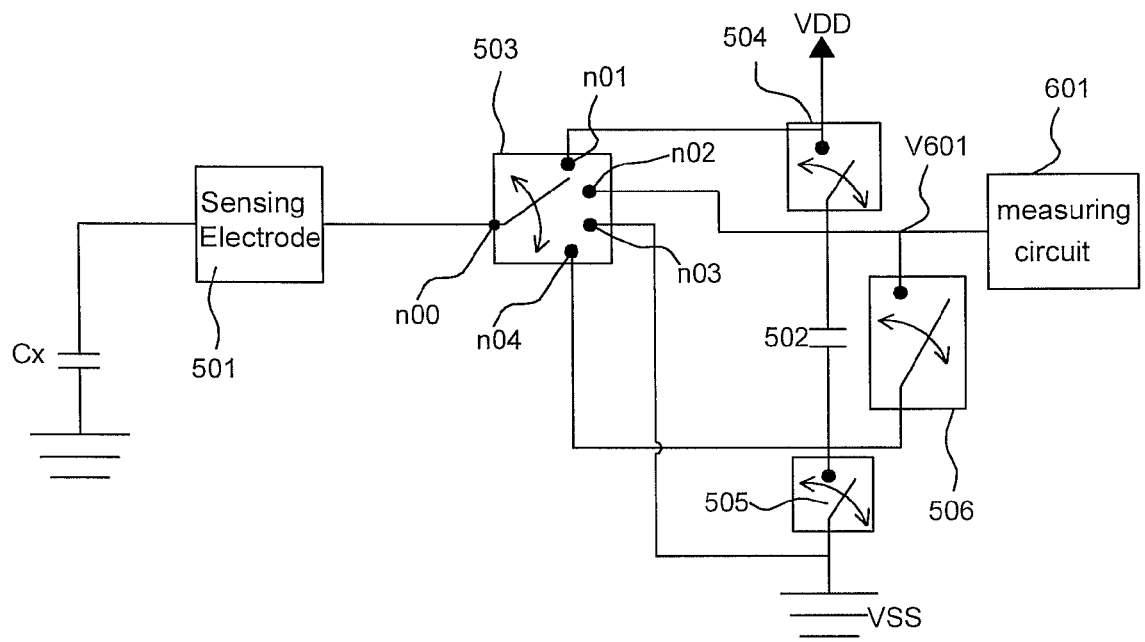
FIG. 6 shows an example of the arrangement of a measuring circuit of the capacitive sensor according to the embodiment of the invention.

In the first aspect, as shown in FIG. 6, a measuring circuit 601 is coupled to the sensing capacitor 502 and the second switch element 504. Therefore, the measuring circuit 601 measures whether or not a voltage V601 of one terminal of the sensing capacitor 502 is greater than a threshold voltage only in the second period to judge whether or not the conductor or the finger touches or approaches the sensing electrode 501.

Figure 7:
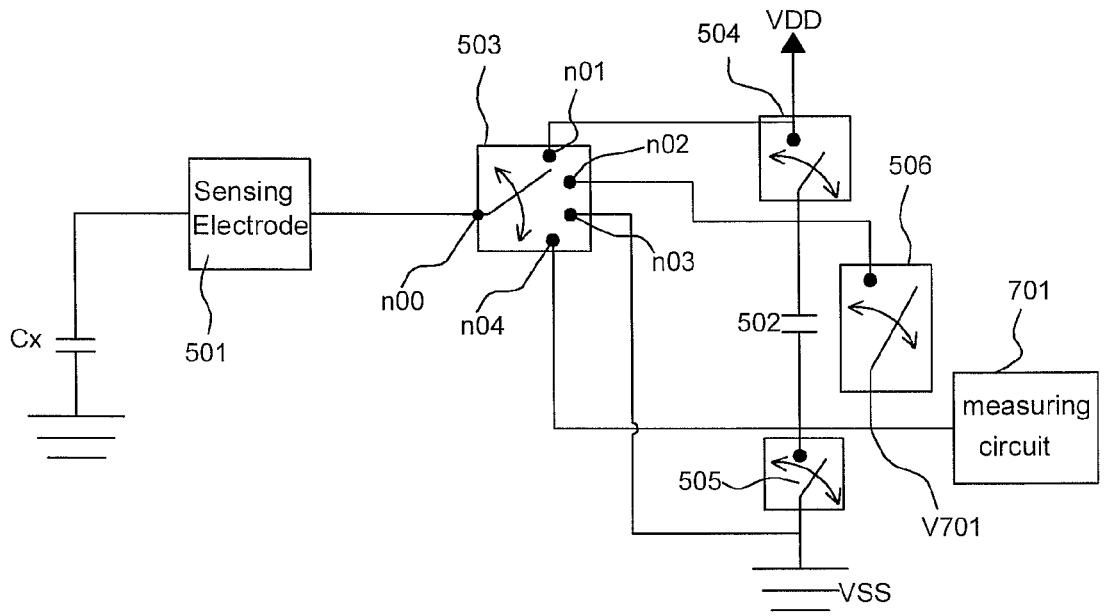
FIG. 7 shows another example of the arrangement of the measuring circuit of the capacitive sensor according to the embodiment of the invention.

In the second aspect, as shown in FIG. 7, a measuring circuit 701 is coupled to the sensing capacitor 502 and the third switch element 505. Therefore, the measuring circuit 701 measures whether a voltage V701 of the other terminal of the sensing capacitor 502 is greater than a threshold voltage only in the fourth period to judge whether or not the conductor or the finger touches or approaches the sensing electrode 501.

Figure 8:
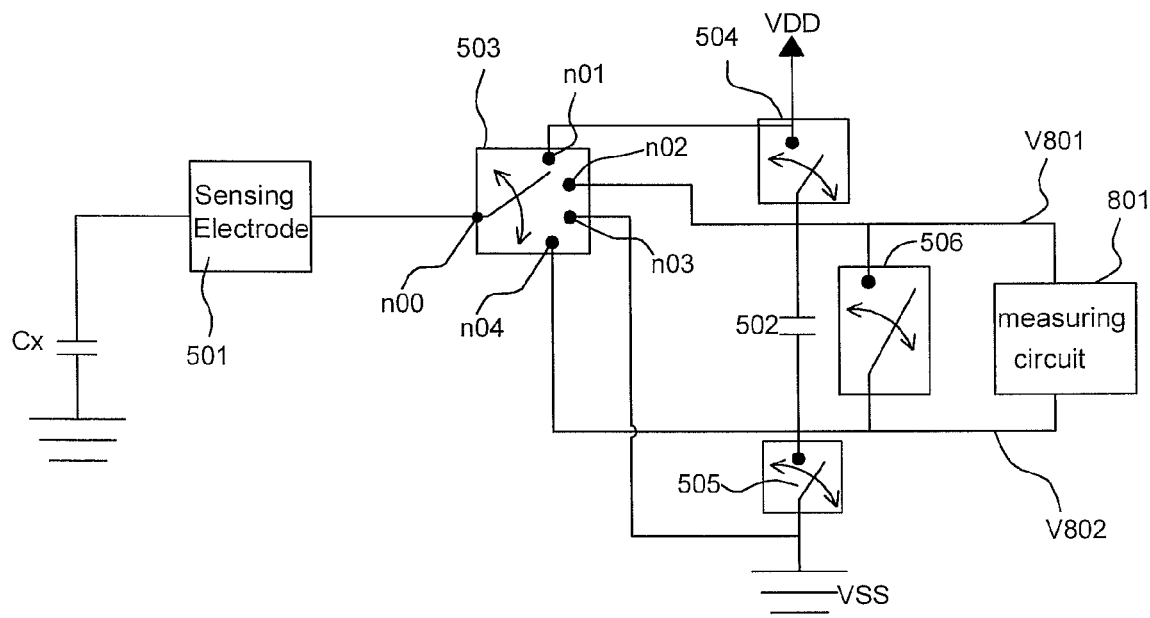
FIG. 8 shows still another example of the arrangement of the measuring circuit of the capacitive sensor according to the embodiment of the invention.

In the third aspect, as shown in FIG. 8, a measuring circuit 801 coupled to the two terminals of the sensing capacitor 502 measures the voltage difference between a voltage V801 of one terminal of the sensing capacitor 502 and a voltage V802 of the other terminal of the sensing capacitor 502, and compares whether or not the voltage difference is greater than a threshold voltage to judge whether or not the conductor or the finger touches or approaches the sensing electrode 501.

Although one possible aspect of the capacitive sensor according to the embodiment of the invention has been illustrated, one of ordinary skill in the art may understand that various manufacturers have different designs for the sensing electrode 501, and the circuit designs thereof may be slightly changed according to the different sensing electrode. Thus, the application of the invention is not particularly restricted. In other words, the essence of the invention can be satisfied as long as the sensing electrode is positively charged, then the sensing capacitor and the sensing electrode are charge-balanced, then the sensing electrode is negatively charged, and finally the sensing electrode and the sensing capacitor are charge-balanced in the circuit operation, or as long as the sensing electrode is negatively charged, then the sensing capacitor and the sensing electrode are charge-balanced, then the sensing electrode is positively charged, and finally the sensing electrode and the sensing capacitor are charge-balanced.

Several other embodiments of the invention will be described so that one of ordinary skill in the art may easily implement the invention.

Figure 9:
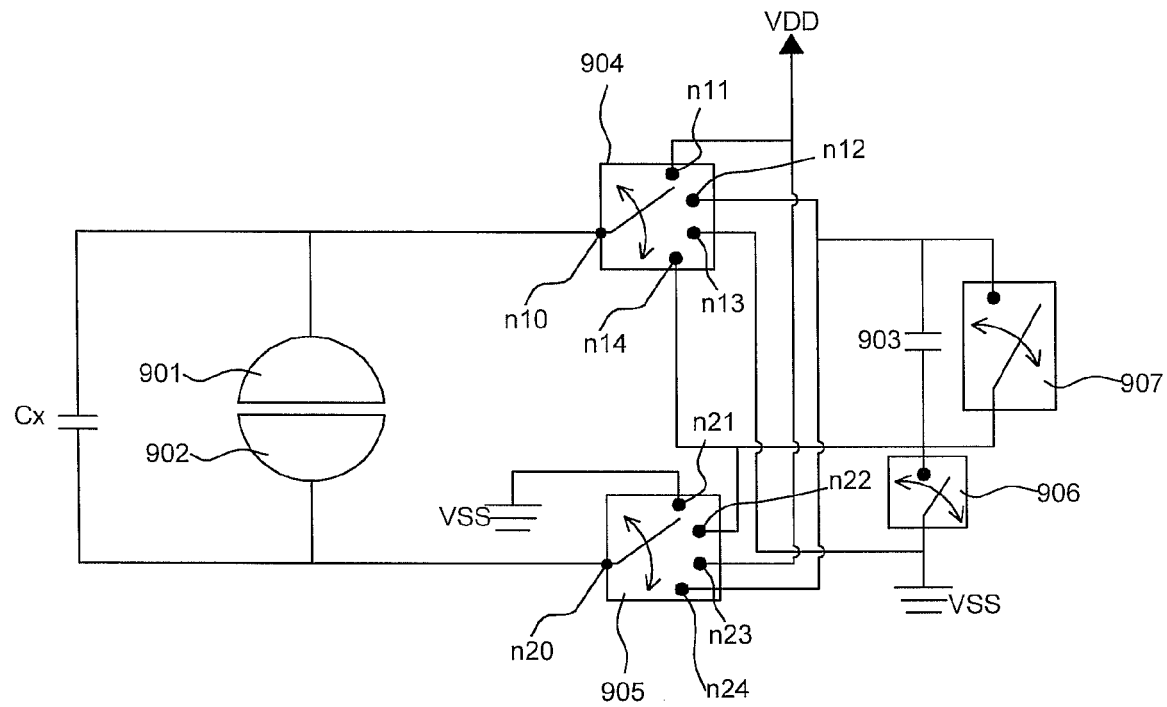
FIG. 9 is a circuit diagram showing a capacitive sensor according to the other embodiment of the invention.

FIG. 9 is a circuit diagram showing a capacitive sensor according to the other embodiment of the invention. Referring to FIG. 9, the capacitive sensor includes a first sensing electrode 901, a second sensing electrode 902, a sensing capacitor 903, a first switch element 904, a second switch element 905, a third switch element 906 and a fourth switch element 907. In order to describe the operation of this embodiment, nodes n10, n11, n12, n13, n14, n20, n21, n22, n23 and n24, and common voltages VDD and VSS are labeled in FIG. 9. In order to make one of ordinary skill in the art understand the spirit of this invention, it is assumed that the common voltage VDD is the power voltage, and the common voltage VSS is the ground voltage in this embodiment. The circuit connection relationship of this capacitive sensor is illustrated in the drawing.

In the capacitive sensor, the special feature is that the capacitive sensor has two sensing electrodes 901 and 902, which constitute an equivalent capacitor Cx. Before the circuit of the capacitive sensor performs a sensing operation, the fourth switch element 907 is first short-circuited so as to balance charges stored in the sensing capacitor 903. Similar to that mentioned hereinabove, the fourth switch element 907 does not have to be a switch. One of ordinary skill in the art may easily understand that the fourth switch element 907 may be replaced with a resistor if the discharge time and the sensing time are properly controlled. Thus, the invention is not particularly limited thereto.

When the circuit of the capacitive sensor performs the sensing operation, the principle of the sensing method is the same as that of FIG. 5 but the practice of the sensing method is slightly different from that of FIG. 5. When the sensing operation is being performed, the sensing time of the capacitive sensor is similarly divided into foul periods, and the sensing operation is similarly divided into four steps.

In the first step, the node n10 of the first switch element 904 is electrically connected to the node n11 of the first switch element 904 while the node n20 of the second switch element 905 is electrically connected to the node n21 of the second switch element 905 in the first period. At this time, the sensing electrode 901 is charged to the power voltage VDD, and the sensing electrode 902 is discharged to the ground voltage VSS.

In the second step, the node n10 of the first switch element 904 is electrically connected to the node n12 of the first switch element 904 while the node n20 of the second switch element 905 is electrically connected to the node n22 of the second switch element 905 in the second period. In addition, the third switch element 906 is turned on. At this time, the positive charges stored in the sensing electrode 901 are shared with the sensing capacitor 903. In the previous step, if the conductor or the finger touches or approaches the sensing electrodes 901 and 902, the equivalent capacitance Cx is increased, the charges stored between the sensing electrodes 901 and 902 are relatively increased, and the charges shared with the sensing capacitor 903 are relatively increased.

In the third step, the node n10 of the first switch element 904 is electrically connected to the node n13 of the first switch element 904, while the node n20 of the second switch element 905 is electrically connected to the node n23 of the second switch element 905 in the third period. At this time, the sensing electrode 901 is discharged to the ground voltage VSS, and the sensing electrode 902 is charged to the power voltage VDD.

In the fourth step, the node n10 of the first switch element 904 is electrically connected to the node n14 of the first switch element 904, while the node n20 of the second switch element 905 is electrically connected to the node n24 of the second switch element 905 in the fourth period. In addition, the third switch element 906 is turned on. At this time, the positive charges stored in the sensing electrode 902 are shared with the sensing capacitor 903. Correspondingly, the sensing capacitor 903 is reversely charged. Similarly, when the conductor or the finger touches or approaches the sensing electrodes 901 and 902 in the third period, the equivalent capacitance Cx is increased. At this time, the charges stored between the sensing electrodes 901 and 902 are relatively increased, and the charges shared with the sensing capacitor 903 are relatively increased in this step.

According to the repeated operations of the foul steps, whether or not the conductor or the finger touches or approaches the sensing electrodes 901 and 902 can be obtained as long as the voltage difference between the two terminals of the sensing capacitor 903 is detected. In this embodiment, two suggested methods are provided to detect whether or not the conductor or the finger touches or approaches the sensing electrodes 901 and 902.

In the first method, the steps are repeated a predetermined number of times, then the voltage difference between the two terminals of the sensing capacitor 903 is measured, and finally the difference is compared with a threshold voltage. Whether or not the conductor or the finger touches or approaches the sensing electrodes 901 and 902 can be determined according to the compared result.

In the second method, the voltage difference between the two terminals of the sensing capacitor 903 is continuously detected, and the difference is continuously compared with the threshold voltage. When the difference is greater than the threshold voltage, it is judged whether or not the conductor or the finger touches or approaches the sensing electrodes 901 and 902 according to the number of times of executing the steps.

If a measuring circuit is to be disposed, at least three aspects of the arrangements and connection relationships of the measuring circuit may be selected.

Figure 10:
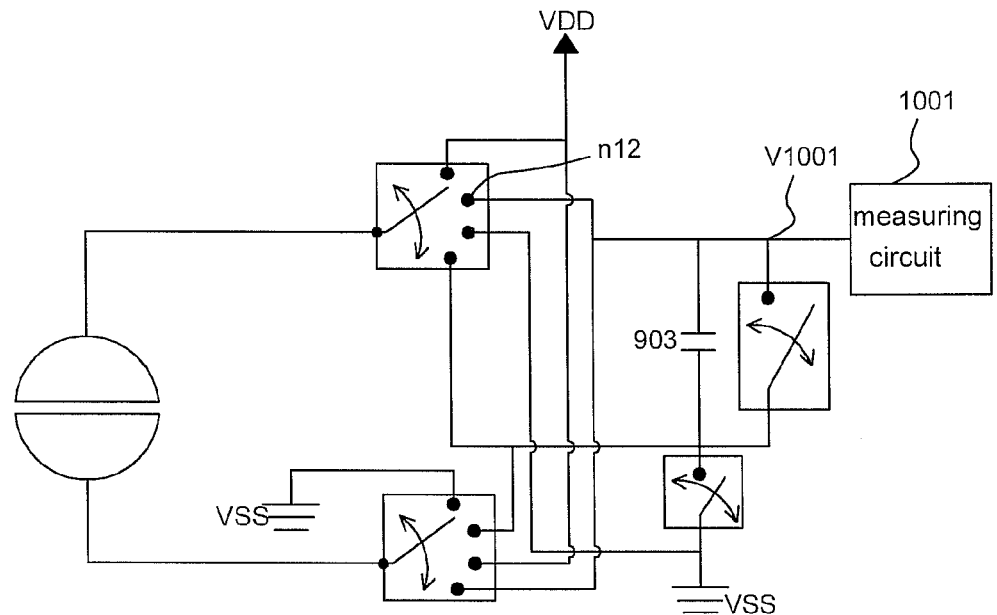
FIG. 10 shows an example of the arrangement of a measuring circuit of the capacitive sensor according to the other embodiment of the invention.

In the first aspect, as shown in FIG. 10, a measuring circuit 1001 is coupled to a connection portion between the sensing capacitor 903 and the node n12. Therefore, the measuring circuit 1001 measures whether or not a voltage V1001 of one terminal of the sensing capacitor 903 is greater than a threshold voltage in the second period or the fourth period to judge whether or not the conductor or the finger touches or approaches the sensing electrodes 901 and 902.

Figure 11:
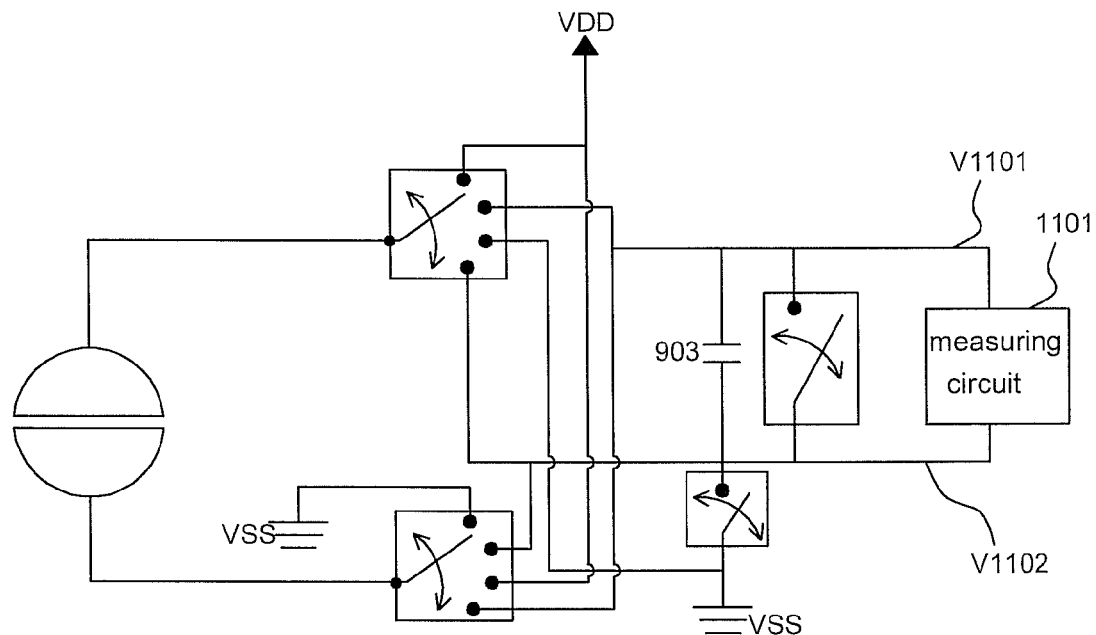
FIG. 11 shows another example of the arrangement of the measuring circuit of the capacitive sensor according to the other embodiment of the invention.

In the second aspect, as shown in FIG. 11, a measuring circuit 1101 coupled to the two terminals of the sensing capacitor 903 measures a voltage difference between a voltage V1101 of one terminal of the sensing capacitor 903 and a voltage V1102 of the other terminal of the sensing capacitor 903, and compares whether or not the voltage difference is greater than a threshold voltage to judge whether or not the conductor or the finger touches or approaches the sensing capacitor 903.

Figure 12:
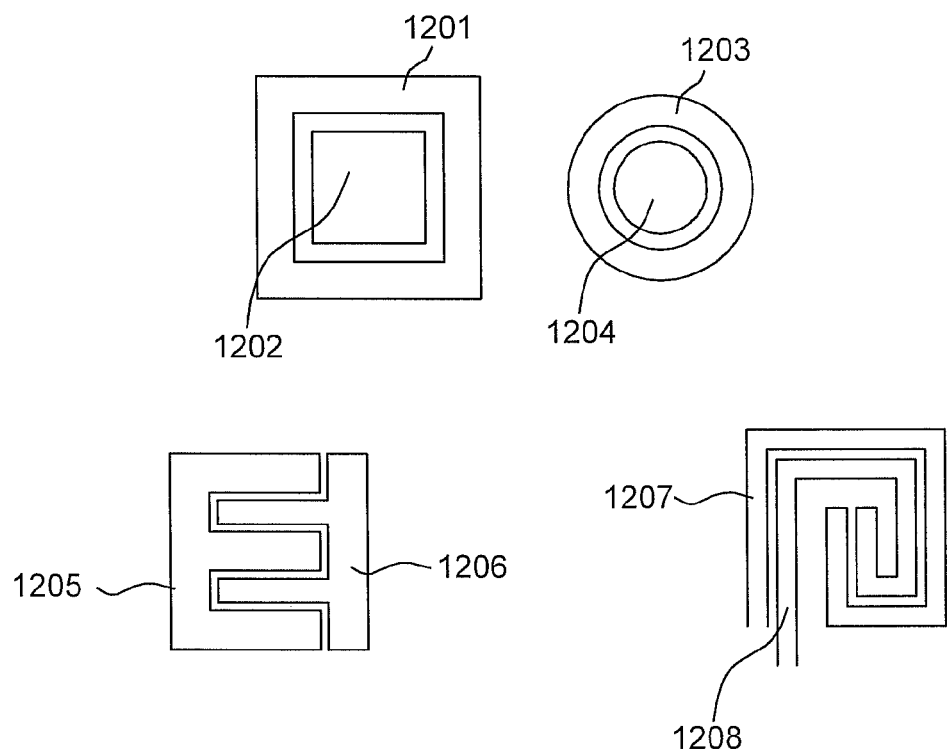
FIG. 12 shows various sensing electrode pairs according to the embodiment of the invention.

Although the sensing electrodes 901 and 902 of this embodiment are two semi-circular sensing electrodes in this illustrated example, one of ordinary skill in the art may understand that the sensing electrodes 901 and 902 in FIGS. 9 to 11 may also be replaced with one of the various sensing electrode pairs, such as sensing electrodes 1201 and 1202, sensing electrodes 1203 and 1204, sensing electrodes 1205 and 1206, and sensing electrodes 1207 and 1208 of FIG. 12. Therefore, the invention is not particularly restricted to the semi-circular sensing electrodes 901 and 902. In addition, the circuits in FIGS. 9 to 11 are applied to the sensor with one single key. In the following, the capacitive sensor applied to the two-dimensional flat panel sensing according to the same technology will be described.

Figure 13:
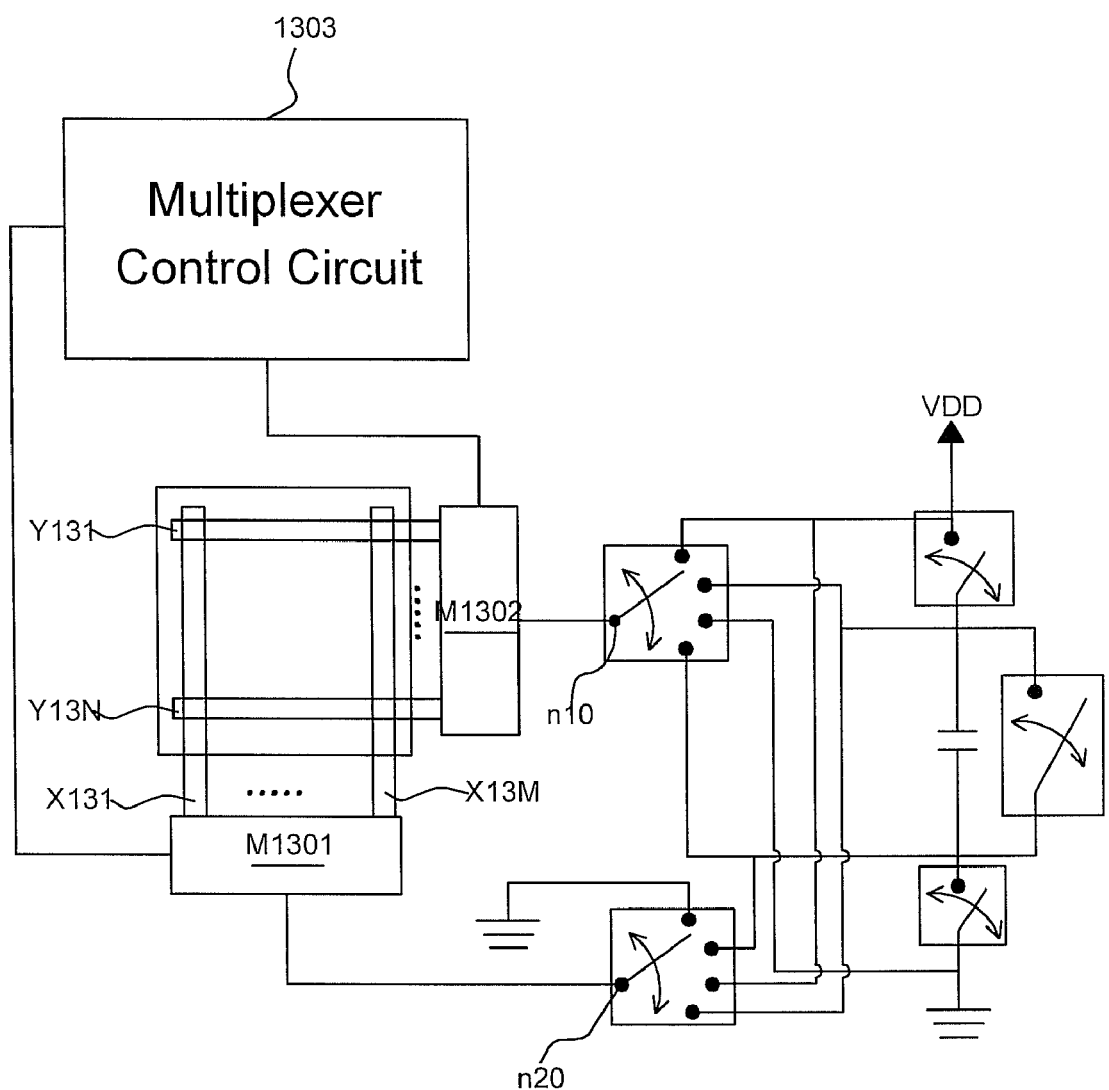
FIG. 13 is a circuit diagram showing a two-dimensional flat panel capacitive sensor according to the embodiment of the invention.

FIG. 13 is a circuit diagram showing a two-dimensional flat panel capacitive sensor according to the embodiment of the invention. Referring to FIG. 13, the structure of this circuit is basically the same as that of FIG. 9, but the circuit additionally includes M X-axis sensing electrodes X131 to X13M and N Y-axis sensing electrodes Y131 to Y13N, wherein M and N are natural numbers. In addition, the circuit further includes a first multiplexer M1301, a second multiplexer M1302 and a multiplexer control circuit 1303.

The sensing steps of this embodiment are the same as those of the embodiment of FIG. 9, so detailed descriptions thereof will be omitted. However, this embodiment performs the switching operations using the multiplexers. Thus, when the first time of sensing is performed, the multiplexer control circuit 1303 may control the multiplexer M1301 to couple the X-axis sensing electrode X131 to the node n20, and control the multiplexer M1302 to couple the Y-axis sensing electrode Y131 to the node n10, for example. When the second time of sensing is performed, the multiplexer control circuit 1303 can control the multiplexer M1301 to couple the X-axis sensing electrode X132 to the node n20, and control the multiplexer M1302 to couple the Y-axis sensing electrode Y131 to the node n10, and so on, for example. Thus, the two-dimensional flat panel sensing operation may be performed. Similarly, when the two-dimensional flat panel sensing operation is performed, the invention can not only avoid the high-frequency external interference, but also effectively resist the interference when the external direct current electrical field or the AC power approaches.

In summary, the essence of the present invention is to positively charge the sensing electrode by controlling the switch element, to charge-balance the sensing capacitor and the sensing electrode, then to negatively charge the sensing electrode, and finally to charge-balance the sensing electrode and the sensing capacitor. Alternatively, the sensing electrode is negatively charged, the sensing capacitor and the sensing electrode are charge-balanced, then the sensing electrode is positively charged, and finally the sensing electrode and the sensing capacitor are charge-balanced. When the sensing capacitor is a sensor, the sensing electrode is positively and negatively charged in the same period. So, the invention can not only effectively improve the high-frequency external interference, but also effectively resist the interference when the external direct current electrical field or the AC power approaches. In addition, the interference can be avoided in the embodiment of the invention, and the sensor may be adopted to the low-cost flat panel scanning.

While the invention has been described by way of examples and in terms of preferred embodiments, it is to be understood that the invention is not limited thereto. To the contrary, it is intended to cover various modifications. Therefore, the scope of the appended claims should be accorded the broadest interpretation so as to encompass all such modifications.

What is claimed is:

1. A capacitive sensor, comprising:

a sensing electrode;

a sensing capacitor;

a first switch element having a first terminal, a second terminal, a third terminal, a fourth terminal and an input terminal, wherein the input terminal of the first switch element is coupled to the sensing electrode, the first terminal of the first switch element is coupled to a first common voltage, the second terminal of the first switch element is coupled to a first terminal of the sensing capacitor, the third terminal of the first switch element is coupled to a second common voltage, and the fourth terminal of the first switch element is coupled to a second terminal of the sensing capacitor;

a second switch element having a first terminal and a second terminal, wherein the first terminal of the second switch element is coupled to the first terminal of the sensing capacitor, and the second terminal of the second switch element is coupled to the first common voltage; and a third switch element having a first terminal and a second terminal, wherein the first terminal of the third switch element is coupled to the second terminal of the sensing capacitor, and the second terminal of the third switch element is coupled to the second common voltage, wherein, a sensing time is divided into a first period, a second period, a third period and a fourth period, in the first period, the first terminal of the first switch element is electrically connected to the input terminal of the first switch element, in the second period, the second terminal of the first switch element is electrically connected to the input terminal of the first switch element, and the first terminal of the third switch element is electrically connected to the second terminal of the third switch element, in the third period, the third terminal of the first switch element is electrically connected to the input terminal of the first switch element, and in the fourth period, the fourth terminal of the first switch element is electrically connected to the input terminal of the first switch element, and the first terminal of the second switch element is electrically connected to the second terminal of the second switch element.

2. The capacitive sensor according to claim 1, wherein the first common voltage is lower than the second common voltage, and the capacitive sensor further comprises:
a measuring circuit, coupled to the first terminal of the sensing capacitor, for measuring whether or not a voltage of the first terminal of the sensing capacitor is greater than a threshold voltage in the second period to determine whether or not the capacitive sensor is touched.

3. The capacitive sensor according to claim 1, wherein the first common voltage is lower than the second common voltage, and the capacitive sensor further comprises:
a measuring circuit, coupled to the second terminal of the sensing capacitor, for measuring whether or not a voltage of the second terminal of the sensing capacitor is greater than a threshold voltage in the fourth period to determine whether or not the capacitive sensor is touched.

4. The capacitive sensor according to claim 1, further comprising:
a measuring circuit, coupled to the first terminal and the second terminal of the sensing capacitor, for measuring whether or not a voltage difference between the first terminal of the sensing capacitor and the second terminal of the sensing capacitor is greater than a threshold voltage to determine whether or not the capacitive sensor is touched.

5. The capacitive sensor according to claim 1, further comprising:
a fourth switch element having a first terminal and a second terminal, wherein the first terminal of the fourth switch element is coupled to the first terminal of the sensing capacitor, and the second terminal of the fourth switch element is coupled to the second terminal of the sensing capacitor,
wherein the sensing time is not entered until the first terminal of the fourth switch element is electrically connected to the second terminal of the fourth switch element for a predetermined time.

6. A capacitive sensor, comprising:
a first sensing electrode;
a second sensing electrode;
a sensing capacitor;
a first switch element having a first terminal, a second terminal, a third terminal, a fourth terminal and an input terminal, wherein the input terminal of the first switch element is coupled to the first sensing electrode, the first terminal of the first switch element is coupled to a first common voltage, the second terminal of the first switch element is coupled to a first terminal of the sensing capacitor, the third terminal of the first switch element is coupled to a second common voltage, and the fourth terminal of the first switch element is coupled to a second terminal of the sensing capacitor; and
a second switch element having a first terminal, a second terminal, a third terminal, a fourth terminal and an input terminal, wherein the input terminal of the second switch element is coupled to the second sensing electrode, the first terminal of the second switch element is coupled to the second common voltage, the second terminal of the second switch element is coupled to the second terminal of the sensing capacitor, the third terminal of the second switch element is coupled to the first common voltage, and the fourth terminal of the second switch element is coupled to the first terminal of the sensing capacitor;

wherein,
a sensing time is divided into a first period, a second period, a third period and a fourth period,
in the first period, the first terminal of the first switch element is electrically connected to the input terminal of the first switch element, and the first terminal of the second switch element is electrically connected to the input terminal of the second switch element,
in the second period, the second terminal of the first switch element is electrically connected to the input terminal of the first switch element, and the second terminal of the second switch element is electrically connected to the input terminal of the second switch element,
in the third period, the third terminal of the first switch element is electrically connected to the input terminal of the first switch element, and the third terminal of the second switch element is electrically connected to the input terminal of the second switch element, and
in the fourth period, the fourth terminal of the first switch element is electrically connected to the input terminal of the first switch element, and the fourth terminal of the second switch element is electrically connected to the input terminal of the second switch element.

7. The capacitive sensor according to claim 6, further comprising:
a third switch element having a first terminal and a second terminal, wherein the first terminal of the third switch element is coupled to the second terminal of the sensing capacitor, and the second terminal of the third switch element is coupled to the second common voltage,
wherein in the second period, the first terminal of the third switch element is electrically connected to the second terminal of the third switch element.

8. The capacitive sensor according to claim 6, wherein the first common voltage is lower than the second common voltage, and the capacitive sensor further comprises:
a measuring circuit, coupled to the first terminal of the sensing capacitor, for measuring whether or not a voltage of the first terminal of the sensing capacitor is greater than a threshold voltage in the second period or the fourth period to determine whether or not the capacitive sensor is touched.

9. The capacitive sensor according to claim 6, further comprising:
a measuring circuit, coupled to the first terminal and the second terminal of the sensing capacitor, for measuring whether or not a voltage difference between the first terminal of the sensing capacitor and the second terminal of the sensing capacitor is greater than a threshold voltage to determine whether or not the capacitive sensor is touched.

10. The capacitive sensor according to claim 6, further comprising:
a fourth switch element having a first terminal and a second terminal, wherein the first terminal of the fourth switch element is coupled to the first terminal of the sensing capacitor, and the second terminal of the fourth switch element is coupled to the second terminal of the sensing capacitor,
wherein the sensing time is not entered until the first terminal of the fourth switch element is electrically connected to the second terminal of the fourth switch element for a predetermined time.

11. A capacitive sensor comprising:
a plurality of first sensing electrodes;
a plurality of second sensing electrodes;

a first multiplexer having a plurality of first connection terminals and a second connection terminal, wherein the first connection terminals of the first multiplexer are correspondingly coupled to the first sensing electrodes;

a second multiplexer having a plurality of first connection terminals and a second connection terminal, wherein the first connection terminals of the second multiplexer are correspondingly coupled to the first sensing electrodes;

a sensing capacitor;

a first switch element having a first terminal, a second terminal, a third terminal, a fourth terminal and an input terminal, wherein the input terminal of the first switch element is coupled to the second connection terminal of the first multiplexer, the first terminal of the first switch element is coupled to a first common voltage, the second terminal of the first switch element is coupled to a first terminal of the sensing capacitor, the third terminal of the first switch element is coupled to a second common voltage, and the fourth terminal of the first switch element is coupled to a second terminal of the sensing capacitor; and a second switch element having a first terminal, a second terminal, a third terminal, a fourth terminal and an input terminal, wherein the input terminal of the second switch element is coupled to the second connection terminal of the second multiplexer, the first terminal of the second switch element is coupled to the second common voltage, the second terminal of the second switch element is coupled to the second terminal of the sensing capacitor, the third terminal of the second switch element is coupled to the first common voltage, and the fourth terminal of the second switch element is coupled to the first terminal of the sensing capacitor;

wherein, a sensing time is divided into a first period, a second period, a third period and a fourth period, in the first period, the first terminal of the first switch element is electrically connected to the input terminal of the first switch element, the first terminal of the second switch element is electrically connected to the input terminal of the second switch element, in the second period, the second terminal of the first switch element is electrically connected to the input terminal of the first switch element, and the second terminal of the second switch element is electrically connected to the input terminal of the second switch element, in the third period, the third terminal of the first switch element is electrically connected to the input terminal of the first switch element, and the third terminal of the second switch element is electrically connected to the input terminal of the second switch element, and in the fourth period, the fourth terminal of the first switch element is electrically connected to the input terminal of the first switch element, and the fourth terminal of the second switch element is electrically connected to the input terminal of the second switch element.

12. The capacitive sensor according to claim 11, further comprising:

a third switch element having a first terminal and a second terminal, wherein the first terminal of the third switch element is coupled to the second terminal of the sensing capacitor, and the second terminal of the third switch element is coupled to the second common voltage, wherein in the second period, the first terminal of the third switch element is electrically connected to the second terminal of the third switch element.

13. The capacitive sensor according to claim 11, further comprising:

a fourth switch element having a first terminal and a second terminal, wherein the first terminal of the fourth switch element is coupled to the first terminal of the sensing capacitor, and the second terminal of the fourth switch element is coupled to the second terminal of the sensing capacitor, wherein the sensing time is not entered until the first terminal of the fourth switch element is electrically connected to the second terminal of the fourth switch element for a predetermined time.

14. The capacitive sensor according to claim 11, wherein the first common voltage is lower than the second common voltage, and the capacitive sensor further comprises:

a measuring circuit, coupled to the first terminal of the sensing capacitor, for measuring whether or not a voltage of the first terminal of the sensing capacitor is greater than a threshold voltage in the second period or the fourth period to determine whether or not the capacitive sensor is touched.

15. The capacitive sensor according to claim 11, further comprising:

a measuring circuit, coupled to the first terminal of the sensing capacitor and the second terminal of the sensing capacitor, for measuring whether or not a voltage difference between the first terminal of the sensing capacitor and the second terminal of the sensing capacitor is greater than a threshold voltage to determine whether or not the capacitive sensor is touched.

16. The capacitive sensor according to claim 11, further comprising:

a multiplexer control circuit for controlling whether or not the second connection terminal of the first multiplexer is electrically connected to one of the first connection terminals of the first multiplexer, and controlling whether or not the second connection terminal of the second multiplexer is electrically connected to one of the first connection terminals of the second multiplexer.

* * * * *